(12) United States Patent
Hui et al.

(10) Patent No.: US 11,394,398 B2
(45) Date of Patent: Jul. 19, 2022

(54) ADAPTIVE SELECTION AND EFFICIENT STORAGE OF INFORMATION BIT LOCATIONS FOR POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US); Leefke Grosjean, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 23 days.

(21) Appl. No.: 16/610,728

(22) PCT Filed: Apr. 16, 2018

(86) PCT No.: PCT/IB2018/052629
§ 371 (c)(1),
(2) Date: Nov. 4, 2019

(87) PCT Pub. No.: WO2018/203164
PCT Pub. Date: Nov. 8, 2018

(65) Prior Publication Data
US 2020/0169272 A1    May 28, 2020

Related U.S. Application Data

(60) Provisional application No. 62/502,279, filed on May 5, 2017.

(51) Int. Cl.
*H03M 13/13*    (2006.01)
*H03M 13/25*    (2006.01)
*H03M 13/00*    (2006.01)

(52) U.S. Cl.
CPC ......... *H03M 13/13* (2013.01); *H03M 13/251* (2013.01); *H03M 13/611* (2013.01); *H03M 13/6362* (2013.01)

(58) Field of Classification Search
None
See application file for complete search history.

(56) References Cited

U.S. PATENT DOCUMENTS 6,347,122 B1 * 2/2002 Chen ................ H04L 1/0059
375/262
8,934,329 B2 * 1/2015 Walton ............. H04L 25/0242
370/208

(Continued)

FOREIGN PATENT DOCUMENTS

EP    3 119 020 A1    1/2017

OTHER PUBLICATIONS (Niu et al),Beyond Turbo Codes—Rate-Compatible Punctured Polar Codes, IEEE-ICC,(2013) (Year: 2013).*

(Continued)

*Primary Examiner* — April Y Blair
*Assistant Examiner* — Matthew W Wahlin
(74) *Attorney, Agent, or Firm* — Sage Patent Group

(57) ABSTRACT

According to certain embodiments, a method for use in a transmitter comprises selecting an information set or sequence of information sets for polar encoding. The information set or sequence of information sets are selected from a plurality of information sets based on one or more system parameters and/or one or more link measurements. The method further comprises performing polar encoding for a plurality of data bits to yield encoded data. The polar encoding is performed according to the selected information set or sequence of information sets. The method further comprises transmitting the encoded data to a receiver.

23 Claims, 12 Drawing Sheets

(56) References Cited

U.S. PATENT DOCUMENTS

| | | | | |
|---|---|---|---|---|
| 9,496,893 | B1* | 11/2016 | Strohm, III | H03M 7/40 |
| 2002/0041570 | A1* | 4/2002 | Ptasinski | H04L 1/1848 |
| | | | | 370/252 |
| 2003/0072395 | A1* | 4/2003 | Jia | H04L 25/0236 |
| | | | | 375/341 |
| 2016/0182187 | A1* | 6/2016 | Kim | H03M 13/353 |
| | | | | 714/807 |
| 2016/0204811 | A1 | 7/2016 | Goela et al. | |
| 2016/0285479 | A1* | 9/2016 | El-Khamy | H03M 13/616 |
| 2016/0308644 | A1* | 10/2016 | Shen | H03M 13/6306 |
| 2017/0019214 | A1* | 1/2017 | Shen | H04L 1/0067 |

OTHER PUBLICATIONS

PCT International Search Report for International application No. PCT/IB2018/052629—dated Aug. 1, 2018.

PCT Written Opinion of the International Searching Authority for International application No. PCT/IB2018/052629—dated Aug. 1, 2018.

3GPP TSG-RAN WG1 #88bis; Spokane, U.S.; Source: Ericsson; Title: Performance Comparison of Rate Matching Schemes for Polar Codes (R1-1704318)—Apr. 3-7, 2017.

Cooperative Coding Scheme Using Polar Codes by Hui Kong et al.; 2012 2nd International Conference on Computer Science and Network Technology—2012.

Incremental Redundancy Cooperative Coding Using Complementary Punctured Convolutional Codes With Receive Diversity in Nakagami Fading Environments by Mahmood Mohassel Feghhi and Bahman Abolhassani; 2008 International Symposium on Telecommunications—2008.

European Office Action for European Patent Application No. 18721483.8 dated Dec. 6, 2021, 6 pages.

Seidal, Mathis et al., "Aspects of Polar-Coded Modulation", Nov. 29, 2012, Erlangen, Germany, 6 pages, XP055390385.

El-Khamy, Mostafa et al., "Circular Buffer Rate-Matched Polar Codes", Cornell University Library, Feb. 14, 2017, 30 pages, XP081274022.

* cited by examiner

ADAPTIVE SELECTION AND EFFICIENT STORAGE OF INFORMATION BIT LOCATIONS FOR POLAR CODES

PRIORITY

This nonprovisional application is a U.S. National Stage Filing under 35 U.S.C. § 371 of International Patent Application Serial No. PCT/IB2018/052629 filed Apr. 16, 2018 and entitled "Adaptive Selection and Efficient Storage of information Bit Locations for Polar Codes" which claims priority to U.S. Provisional Patent Application No, 62/502,279 filed May 5, 2017 both of which are hereby incorporated by, reference in their entirety.

TECHNICAL FIELD

In general, certain embodiments of the present disclosure relate to wireless communications. More particularly, certain embodiments relate to adaptive selection of information bit locations for polar codes.

BACKGROUND

Polar codes, proposed by Arikan, are the first class of constructive coding schemes that are provable to achieve the symmetric capacity of the binary-input discrete memoryless channels under a low-complexity successive cancellation (SC) decoder. See E. Arikan, "*Channel Polarization: A Method for Constructing Capacity-Achieving Codes for Symmetric Binary-Input Memoryless Channels*," IEEE Transactions on Information Theory, vol. 55, pp. 3051-3073, July 2009 (hereinafter, "[1]"). However, the finite-length performance of polar codes under SC is not competitive compared to other modern channel coding schemes such as low-density parity-check (LDPC) codes and Turbo codes. Later, SC list (SCL) decoder is proposed by Tal et al., which can approach the performance of optimal maximum-likelihood (ML) decoder. See I. Tal and A. Vardy, "*List Decoding of polar codes*," in Proceedings of IEEE Symp. Info. Theory, pp. 1-5, 2011 (hereinafter, "[2]"). By concatenating a simple cyclic redundancy check (CRC) coding, it was shown that the performance of concatenated polar code is competitive with that of well-optimized LDPC and Turbo codes. As a result, polar codes are being considered as a candidate for future 5G wireless communication systems. Additional background related to polar codes is described by Leroux. See Leroux, et. al., "*A Semi-Parallel Successive-Cancellation Decoder for Polar Codes*," IEEE TRANSACTIONS ON SIGNAL PROCESSING, VOL. 61, NO. 2, Jan. 15, 2013 (hereinafter, "[3]").

The main idea of polar coding is to transform a pair of identical binary-input channels into two distinct channels of different qualities, one better and one worse than the original binary-input channel. By repeating such a pair-wise polarizing operation on a set of $N=2^n$ independent uses of a binary-input channel, a set of $2^n$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. Loading the data into the proper information bit locations have directly impact on the performance of a polar code. An illustration of the structure of a length-8 polar code is illustrated in FIG. 1 (example of polar code structure with N=8).

FIG. 2, polar code encoder with N=8, illustrates the labeling of the intermediate info bits $s_{l,i}$, where $l \in \{0,1, \ldots n\}$ and $i \in \{0,1, \ldots, N-1\}$ during polar encoding with N=8. The intermediate info bits are related by the following equation:

$$s_{l+1,i} = s_{l,i} \oplus s_{l,i+2^l}, \text{ for}$$
$$i \in \left\{ j \in \{0, 1, \ldots, N-1\}: \mod\left(\left\lfloor \frac{j}{2^l} \right\rfloor, 2\right) = 0 \right\} \text{ and}$$
$$l \in \{0, 1, \ldots, n-1\}$$
$$s_{l+1,i+2^l} = s_{l,i+2^l}, \text{ for}$$
$$i \in \left\{ j \in \{0, 1, \ldots, N-1\}: \mod\left(\left\lfloor \frac{j}{2^l} \right\rfloor, 2\right) = 0 \right\} \text{ and}$$
$$l \in \{0, 1, \ldots, n-1\}$$

with $s_{0,i} \equiv u_i$ be the info bits, and $s_{n,i} \equiv x_i$ be the code bits, for $i \in \{0,1, \ldots, N-1\}$.

SUMMARY

Certain embodiments of the present disclosure may provide solutions to one or more problems associated with using Polar codes. For example, a main design problem of Polar codes is to identify the set of locations of the information bits (or equivalently the frozen bits), which is commonly referred to as the information set (or correspondingly, frozen set). In conventional Polar code design, the information set is determined based on orthogonal frequency division multiplexing an assumption that the underlying binary-input channels (e.g., the channels denoted by W in FIG. 1) from which the polarized bit-channels are transformed are identically distributed. However, in many practical situations, (such as the use of higher modulation schemes, the use of rate-matching schemes to accommodate the amount of radio resources, different channel profiles, different deployment scenarios, etc.), the qualities of the underlying bit-channels are non-uniform. This affects the optimal locations of the information bits.

In one of the embodiments of the present disclosure, an adaptive scheme of Polar coding is described, where the system utilizes multiple collections of information sets, each collection consisting of one information set for every possible number of information bits. For a given scenario, the collection to be used is adaptively determined based on various system parameters and link measurements. The system parameters include, but are not limited to, number of punctured or repeated code bits in rate-matching process, modulation scheme used for the target transmission, resource allocation methods, the direction of communication (uplink or downlink), waveform or multiplexing scheme (e.g., orthogonal frequency division multiplexing (OFDM) vs. discrete Fourier transform spread (DFT-S-OFDM)), multiple input multiple output (MIMO) technique, beamforming/beam-sweeping technique, number of data streams in a MIMO transmission, etc. The link measurements include signal-to-noise levels, amount of delay spread, long-term channel delay profile, Doppler-related measurement, etc.

According to certain embodiments, a transmitter comprises an interface, processing circuitry, and logic. The logic, when executed by the processing circuitry, causes the transmitter to select an information set or sequence of information sets for polar encoding, perform polar encoding for a plurality of data bits to yield encoded data, and transmit the encoded data to a receiver. The information set or sequence of information sets are selected from a plurality of information sets based on one or more system parameters and/or one or more link measurements, and the polar encoding is performed according to the selected information set or sequence of information sets.

According to certain embodiments, a method for use in a transmitter comprises selecting an information set or sequence of information sets for polar encoding. The information set or sequence of information sets are selected from a plurality of information sets based on one or more system parameters and/or one or more link measurements. The method further comprises performing polar encoding for a plurality of data bits to yield encoded data. The polar encoding is performed according to the selected information set or sequence of information sets. The method further comprises transmitting the encoded data to a receiver.

According to certain embodiments, a computer program product comprises a non-transitory computer readable medium storing computer readable program code. The computer readable program code comprises program code for selecting an information set or sequence of information sets for polar encoding. The information set or sequence of information sets are selected from a plurality of information sets based on one or more system parameters and/or one or more link measurements. The computer readable program code further comprises program code for performing polar encoding for a plurality of data bits to yield encoded data. The program code performs the polar encoding according to the selected information set or sequence of information sets. The computer readable medium further comprises program code for transmitting the encoded data to a receiver.

Each of the above-described transmitter, method for use in a transmitter, and/or computer program product may include various other features. Examples of such features include the following;

In some embodiments, performing the polar encoding comprises inputting the data bits into a polar encoder according to an assigned bit location. The assigned bit location is defined by the selected information set or sequence of information sets.

In some embodiments, the one or more system parameters include a rate matching configuration and the information set or sequence of information sets is selected based at least in part on the rate matching configuration. In some embodiments, the rate matching configuration comprises a repetition pattern indicating a subset of the bits of the encoded data to be repeated before transmitting the encoded data. In some embodiments, the rate matching configuration comprises a puncturing pattern that indicates a subset of the bits to be removed from the encoded data before transmitting the encoded data. As an example, in some embodiments, the encoded data comprises a first subset of encoded data bits and a second subset of encoded data bits, and the puncturing pattern indicates to remove the second subset of encoded data bits in response to a determination that another transmitter has been configured to transmit the second subset of encoded data bits to the receiver.

In some embodiments, the one or more system parameters include a modulation scheme and the information set or sequence of information sets is selected based at least in part on the modulation scheme. For example, in some embodiments, the modulation scheme corresponds to an n-order Quadrature Amplitude Modulation (QAM) modulation scheme and the information set or sequence of information sets is selected based at least in part on the QAM modulation order.

In some embodiments, the information set or sequence of information sets is selected based at least in part on one or more of the following system parameters: radio resource allocation with respect to frequency range or time duration, whether the encoded data is being transmitted via uplink or downlink, waveform or multiplexing scheme, number of redundancy versions being transmitted, MIMO technique, beamforming technique, beam-sweeping technique, number of data streams in a MIMO transmission, capabilities of the receiver, and/or cell size.

In some embodiments, the one or more link measurements comprise a channel quality indicator and the information set or sequence of information sets is selected based at least in part on the channel quality indicator.

In some embodiments, the information set or sequence of information sets is selected based at least in part on one or more of the following link measurements: channel delay spread, channel delay profile, and/or Doppler spread.

In some embodiments, the transmitter sends a signal to the receiver indicating which information set or sequence of information sets have been selected for polar encoding.

In some embodiments, the transmitter selects the information set or sequence of information sets based on a signal received from the receiver, wherein the signal indicates which information set or sequence of information sets to select for polar encoding.

In some embodiments, in response to selecting the information set or sequence of information sets, the transmitter obtains the selected information set or sequence of information sets in compressed form, decompresses the compressed form of the selected information set or sequence of information sets, and uses the decompressed form of the selected information set or sequence of information sets when performing the polar encoding.

In some embodiments, the transmitter is implemented in a radio node, such as a radio access node or a wireless device.

Some embodiments of the present disclosure may have one or more technical advantages. As an example, an advantage of certain embodiments is that the code performance for different scenarios can be optimized since the optimal information set selection for polar code is often dependent on various system parameters and link measurements. Certain embodiments may have additional or different advantages which may be apparent to those of ordinary skill in the art.

BRIEF DESCRIPTION

DETAILED DESCRIPTION

Embodiments of the present disclosure are further described below with respect to FIGS. 3-12, wherein like numerals are used for like and corresponding parts of the various figures.

Adaptive Selection of Information Set

Figure 1:
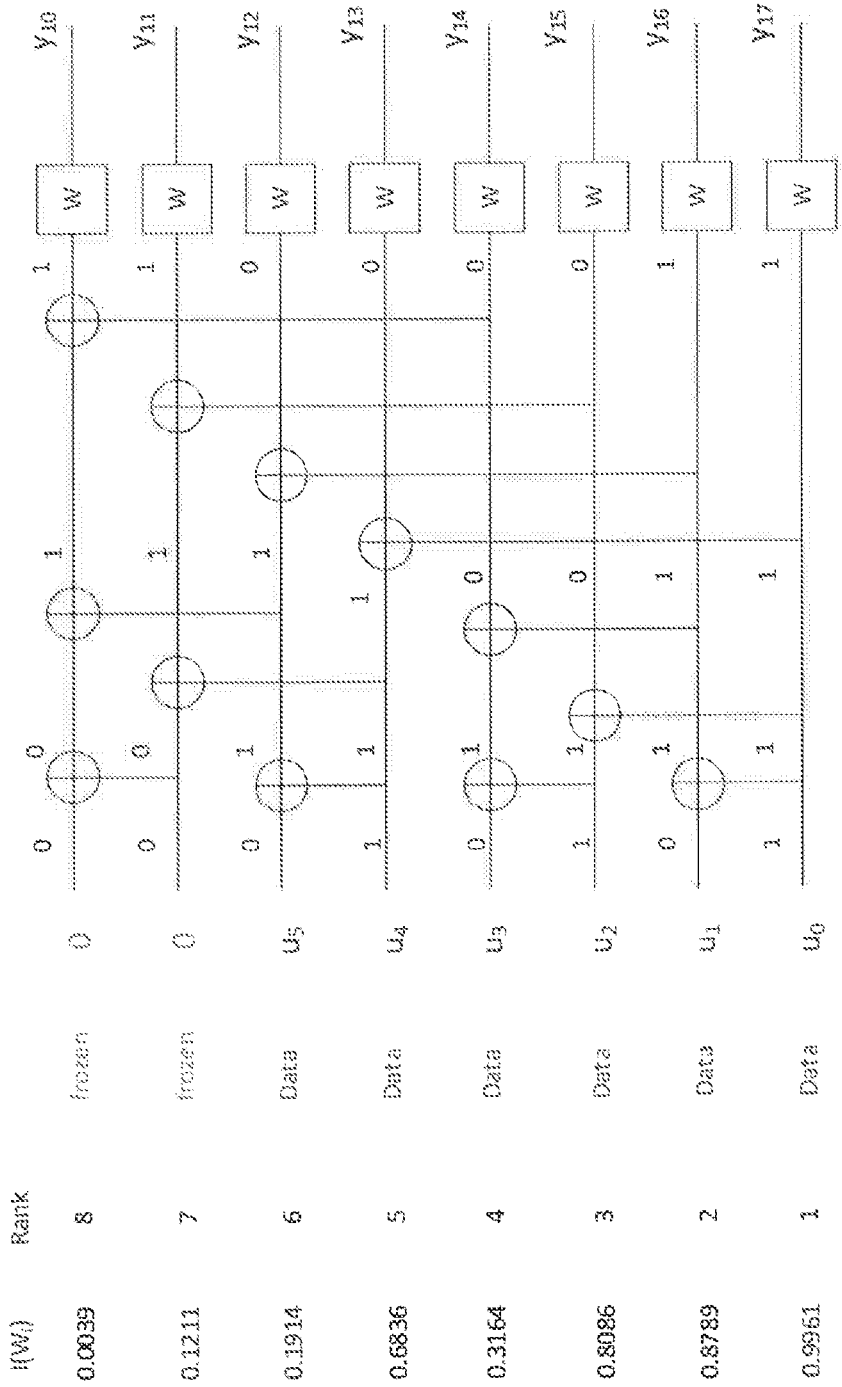
FIG. 1 illustrates an example of polar code structure.
Figure 2:
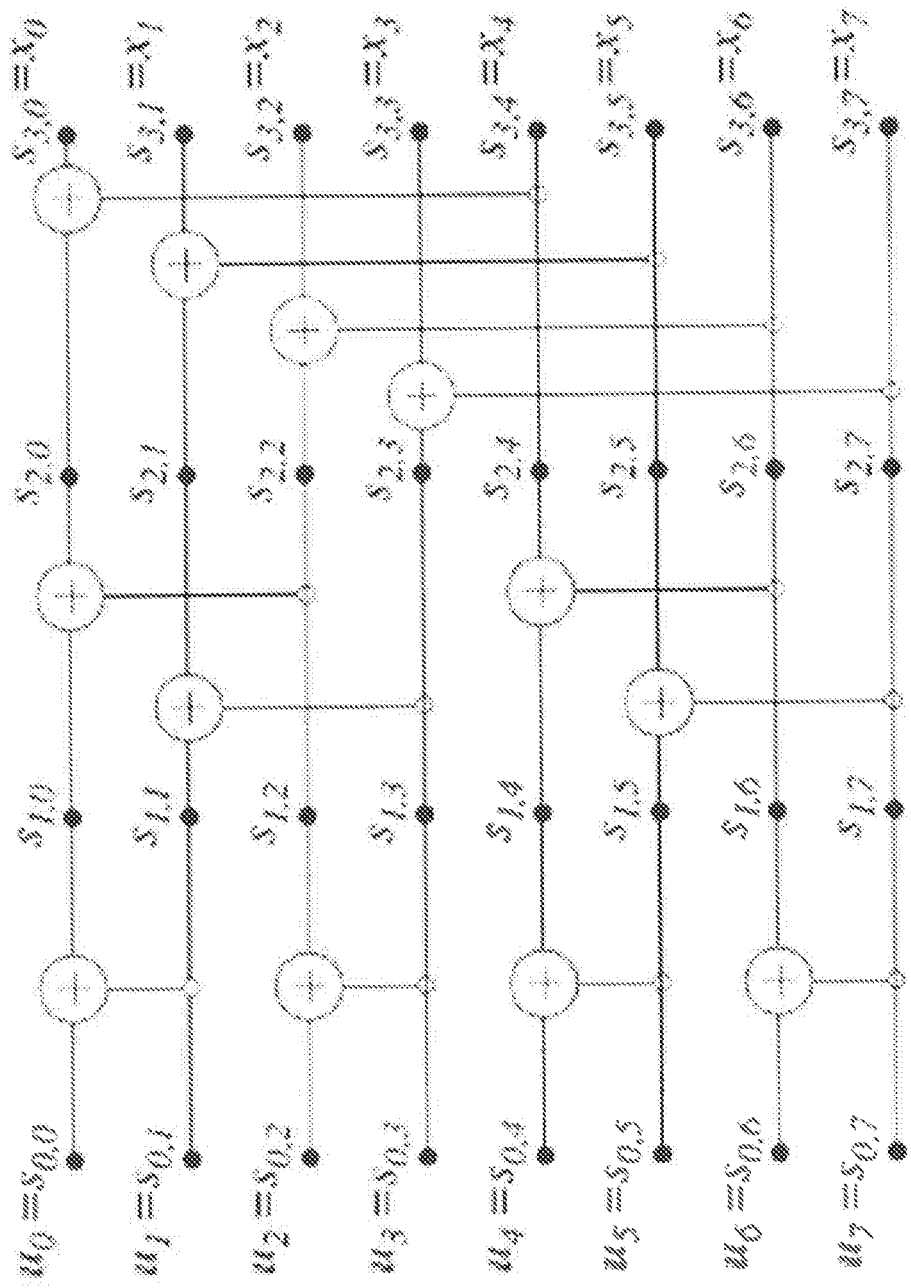
FIG. 2 illustrates an example of a polar encoder.
Figure 3:
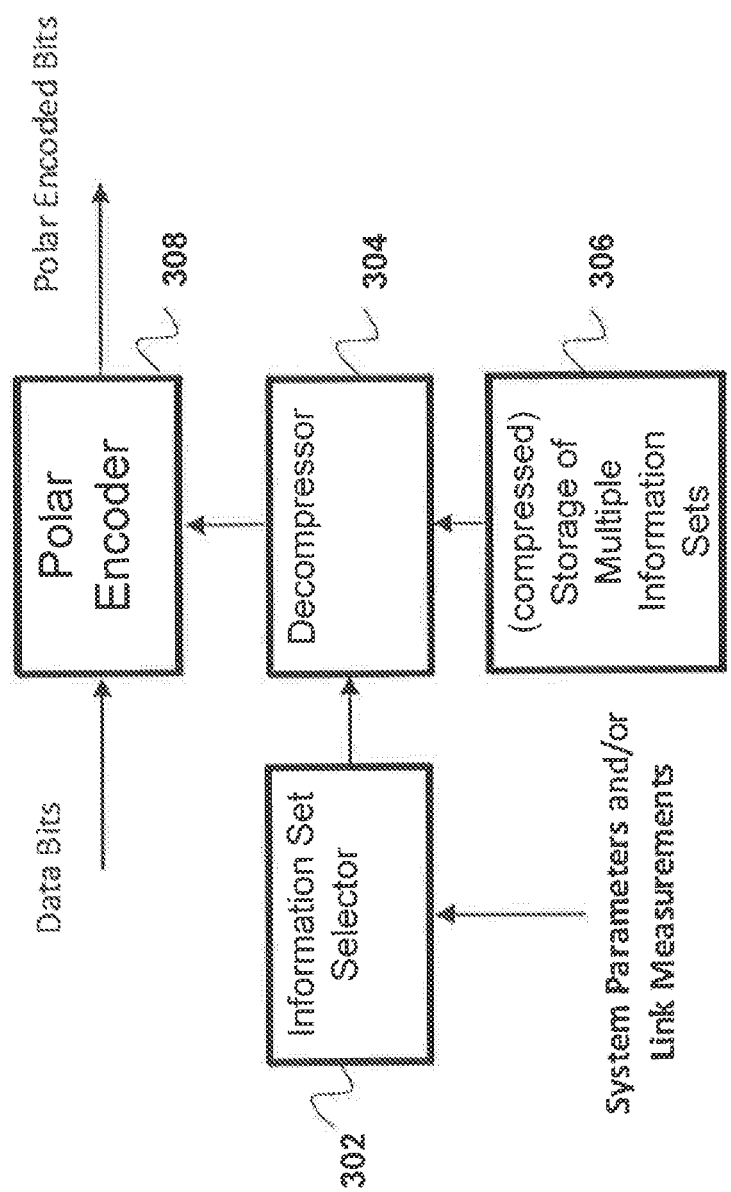
FIG. 3 is a block diagram illustrating an example of adaptive information-set selection with a compressed storage of multiple information sets for Polar codes, in accordance with certain embodiments.
Figure 4:
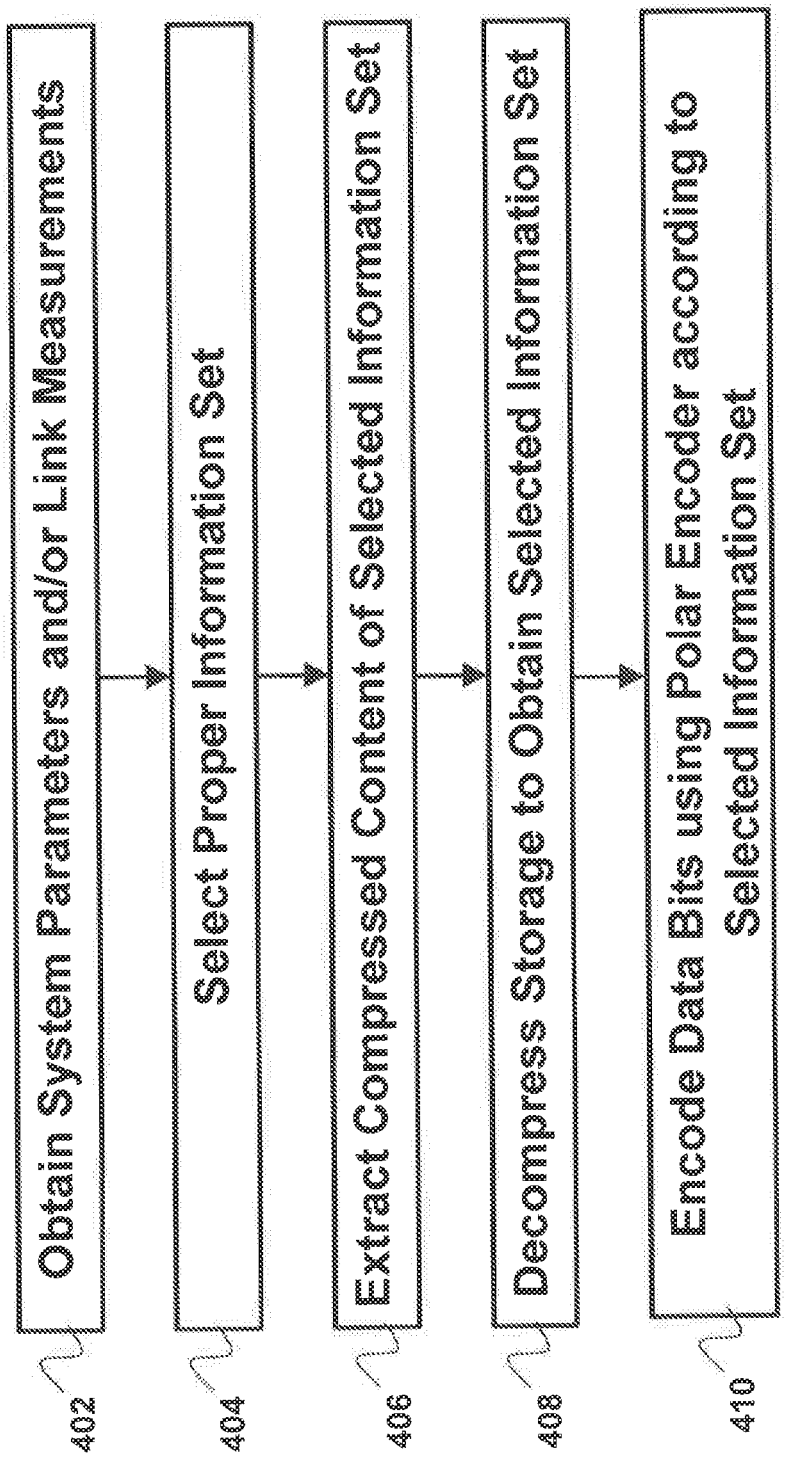
FIG. 4 is a flow diagram illustrating an example of adaptively selecting an information set from a compressed storage comprising multiple information sets for Polar codes, in accordance with certain embodiments.

FIG. 3 shows a block diagram of components that may be used to perform adaptive information-set selection to select an information set or sequence of information sets from multiple information sets for Polar codes. The components shown in FIG. 3 include an information set selector 302, a decompressor 304, compressed storage 306, and polar encoder 308. FIG. 4 shows a flow diagram of a process that may be performed by the components shown in FIG. 3. In step 402, information set selector 302 obtains certain system parameters or link measurements (to be described later) and after that, in step 404, information set selector 302 determines which information set should be used to encode the data bits. The decision is fed into storage decompressor 304, which at step 406 extracts compressed content of the selected information set from compressed storage 306. The compressed content is then decompressed by decompressor 304 in step 408 to obtain the selected information set which is then used by a polar encoder 308 to encode the data bits in step 410.

As noted above, the selection of information sets by information set selector 302 in step 402 may be determined by certain system parameters and/or link measurements. Some examples are described below.

System Parameters

The system parameter may include, but are not limited to, the following:

Rate-Matching
  The number of punctured or repeated bits needed to match the available amount of radio resources can affect the choice of information set. Further discussion on this is given in a separate section below.
Modulation Scheme
  Unlike Quadrature Phase Shift Keying (QPSK) modulation, the channel qualities experienced by the bits mounted on a symbol of higher-order modulation, such as 16 QAM (quadrature amplitude modulation) or 64 QAM, can be different due to the relative distances among constellation points. This creates non-uniformity in the quality of the binary-input channels, which can in turn affect the choice of information set.
Radio Resource Allocation
  Polar code has been adopted in 5G New Radio (NR) for transmitting control information. Control information may be carried by dedicated control channels, such as physical downlink control channel (PDCCH) or physical uplink control channel (PUCCH) in long term evolution (LTE) or embedded in data channels such as physical uplink shared channel (PUSCH) in LTE. Since radio resources are often allocated differently for these channels (e.g., PDCCH is predominated frequency spread and short in time, while physical downlink shared channel, PDSCH, is often spread in both time and frequency), the channel conditions are different which can affect the optimal choice of information set.
  Also, in orthogonal frequency-division multiplexing (OFDM), over the same time duration, the scheduler may allocation subcarriers that are localized in a narrow frequency range or distributed over a wide frequency range. Different ways of allocating radio resources can affect the optimal choice of information set for polar codes
Uplink vs Downlink
  The channel conditions and interference environment for uplink and downlink can be quite different, which can have an impact on the choice of information set.
Waveform or Multiplexing Scheme: OFDM vs DFT-S-OFDM.
  For downlink control information (DCI), OFDM is used. DCI is carried by PDCCH.
  For uplink control information (UCI), both OFDM and discrete Fourier transform spread OFDM (DFT-S-OFDM) can be used. Which waveform to use is up to higher layer signaling. Furthermore, UCI can be carried by PUCCH and PUSCH.
  OFDM and DFT-S-OFDM exhibit different channel quality property to the Polar decoder. For OFDM, the modulation symbols may experience fading channel condition, and the channel log likelihood ratio (LLR) for the modulation symbols can vary widely. For DFT-S-OFDM, in contrast, the modulation symbols carried by the same DFT-S-OFDM symbol experience the same channel condition (possibly dispersive channel), although the channel condition may vary from one DFT-S-OFDM symbol to another DFT-S-OFDM symbol depending on Doppler.
  To adapt to the waveform, the information set used by Polar encoder should be customized accordingly.
Redundancy Versions
  In some communication scenarios, a single transmission is not enough to provide sufficient single reliability or signal coverage to the serviced area. Oftentimes, multiple transmissions of the same block of information bits are needed, for example, in broadcast channels (such as physical broadcast channel, PBCH), system information channels (e.g., system information block (SIB)), hybrid automatic repeat request (HARQ) retransmission protocol. In this case, it is preferred to send a differently coded version of the same information in different transmissions. The selected information sets can be different for these different redundancy versions.
MIMO Transmission
  Depending on the MIMO transmission scheme adopted in a transmission, the channel characteristics of the communication link may change. For example, when more than one data stream is spatially multiplexed for transmissions, the mutual interference among the different streams affect the channel that each stream experiences. The choice of information set may be adjusted accordingly to optimize performance.
Receiver Capability
  Depending on the receiver capability, the selection of information set for Polar codes may be different. Here the receiver mainly refers to the user equipment (UE) receiver on the downlink. For example, if a UE with low-cost hardware can only carry out successive cancellation (SC)

decoding, instead of a SC list decoding, the information set may be chosen accordingly to fit the simple SC decoding.

Deployment Scenario

The channel characteristics in indoor femto-cell deployment of wireless systems are often more less frequency selective than those in out-door macro-cell deployment. As a result, the underlying binary-input channels for polar codes have different statistics, and hence a different choice of information set may be used in different deployment scenarios Note that the above consideration applies to both a single transmission, as well as multiple transmissions of a given packet when incremental redundancy HARQ (IR-HARQ) retransmission methods are used.

Link Measurements

The link measurements may include, but are not limited to, the following:

Signal-to-Noise-Ratio (SNR)

When the code length N is large (e.g., N≥32), different information sets can yield different performances in different SNR range. Hence, if a receiver feeds back SNR or channel quality indicator (CQI) that reflects the quality of the communication link back to the transmitter, such information can be used to determine which information set to use to optimize performance over the communication link.

Channel Delay Spread

The channel delay spread determines the degree of frequency selectivity in the channel response of a communication link. When the polar coded bits are allocated in OFDM subcarriers across a large frequency range, each coded bit may experience different level of fading, and thus the underlying binary-input channels from which polarized bit-channels are derived have drastically different statistics. As a result, if the channel delay spread is fed back to the transmitter by a receiver, a different information set may be used to optimize performance based on this information.

Channel Delay Profile

Similar to channel delay spread, channel delay profile is a long-term channel statistic that describes the degree of frequency selectivity of the channel response of a communication link. If this information is fed back from the receiver to the transmitter, a transmitter can use this information to select a corresponding information set.

Doppler Spread

The Doppler spread provides a measure of how fast the receiver is moving with respect to the transmitter. When the polar coded bits are allocated in time across a long time period, each coded bit may experience different level of fading when the receiver is moving fast. As a result, if the Doppler spread is fed back to the transmitter by a receiver, a different information set may be used to optimize performance based on this information.

As discussed in the above, certain embodiments base the adaptation on certain system parameters or link measurements, so that the adaptation is performed without explicit signaling of the information set. It is also possible that an explicit signaling is defined to signal which information set to use. The explicit signaling can be either:

Semi-statically signaled, e.g., radio resource control (RRC) signaling based; or Dynamically signaled, e.g., DCI signaling based.

As an example, in some embodiments, the transmitter selects an information set or sequence of information sets based on system parameters and/or link measurements, and then sends a signal to the receiver (e.g., using semi-static or dynamic signaling) to indicate which information set or sequence of information sets have been selected for polar encoding. This may allow the receiver to determine which information sets or sequence of information sets to use to decode the polar encoded bits that the receiver receives from the transmitter.

As another example, in some embodiments, the receiver selects an information set or sequence of information sets based on system parameters and/or link measurements, and then sends a signal to the transmitter (e.g., using semi-static or dynamic signaling) to indicate which information set or sequence of information sets have been selected for polar encoding. In some embodiments, the transmitter then selects the information set or sequence of information sets based on the signal received from the receiver and encodes the data bits being sent to the receiver using the selected information set or sequence of information sets.

Adaptive Selection of Rate Matching Pattern

While the information set defines the bit location to assign information bits at the input of Polar encoder, the rate matching pattern defines the set of coded bits to transmit at the output of the encoder. The rate matching pattern includes both (a) puncturing pattern, where some coded bits are removed before transmission; (b) repetition pattern, where some coded bits are repeated before transmission. The choice of the puncturing pattern and repetition pattern can in turn affect the selection of information set.

The puncturing pattern can be adapted according to certain system configuration.

In one example, the adaptation is according to which gNB or transmit point (TP) is sending the data. When two or more TPs jointly send the same data to the UE, each TP may choose a different puncturing pattern, so that when combined, higher diversity gain can be achieved at the UE (i.e., receiver). The two or more TP may jointly serve the UE in coordinated multipoint (CoMP) manner or dual-connectivity manner. The type of puncturing pattern can be selected from multiple variations, for example:

"Natural—Type I":

Puncture code bits with indices $\{0, 1, 2, \ldots, N-M-1\}$, i.e., the first (N−M) bit positions.

"Natural—Type II":

Puncture code bits with indices $\{M+1, M, \ldots, N-1\}$, i.e., the last (N−M) bit positions.

"Bit-reversed—Type I":

Puncture code bits with indices given by bit reversing $\{0, 1, 2, \ldots, N-M-1\}$.

"Bit-reversed Type II":

Puncture code bits with indices given by bit reversing $\{M+1, M, \ldots, N-1\}$, as described in [2].

"Split-natural—Type I":

Puncture the first N/4 bits naturally from bit index 0, and additional bits if needed are punctured alternately from N/4+1 and N/2+1, as described in [3]. More precisely, the set of punctured bit indices $B_p^N$ with p punctured bits is given by:

$$B_p^N = \begin{cases} \{0, 1, 2, \ldots, p-1\} & \text{for } 0 \leq p \leq \frac{N}{4} \\ \left\{0, 1, 2, \ldots, \frac{N}{4} + \left\lceil \frac{p - \frac{N}{4}}{2} \right\rceil - 1\right\} \cup & \text{for } \frac{N}{4} < p < \frac{3N}{4} \\ \left\{\frac{N}{2}, \frac{N}{2}+1, \ldots, \frac{N}{2} + \left\lfloor \frac{p - \frac{N}{4}}{2} \right\rfloor - 1\right\} & \end{cases}$$

"Split-natural—Type II":
Puncture the last N/4 bits in reverse order from bit index N and additional bits if needed are punctured alternately in reverse order from 3N/4 and N/2, complementary puncturing patterns of "Split-natural—Type I" generated as described in Section 2.1.3 of [1]. More precisely, the set of punctured bit indices $B_p^N$ with p punctured bits is given by:

$$B_p^N = \begin{cases} \{N-p, N-p+1, \ldots, N-1\} & \text{for } 0 \leq p \leq \frac{N}{4} \\ \left\{\frac{3N}{4} - \left\lfloor\frac{p-\frac{N}{4}}{2}\right\rfloor, \ldots, N-1\right\} \cup & \text{for } \frac{N}{4} < p < \frac{3N}{4} \\ \left\{\frac{N}{2} - \left\lfloor\frac{p-\frac{N}{4}}{2}\right\rfloor, \ldots, \frac{N}{2} - 1\right\} & \end{cases}$$

"Reliability—Type I":
Use the bit ordering for selecting the frozen bit positions for puncturing [1], i.e., puncture the indices corresponding to the least reliable bit-channel positions first.

"Reliability—Type II":
Use the bit ordering for selecting the information bit positions for puncturing [1], i.e., puncture the indices corresponding to the most reliable bit-channel positions first.

The adaptation can be implicit, where the puncturing pattern to use is derived from other system configuration. Alternatively, the puncturing pattern to use can be signaled explicitly, either
Semi-statically signaled, e.g., RRC signaling based; or
Dynamically signaled, e.g., DCI signaling based.

Figure 5:
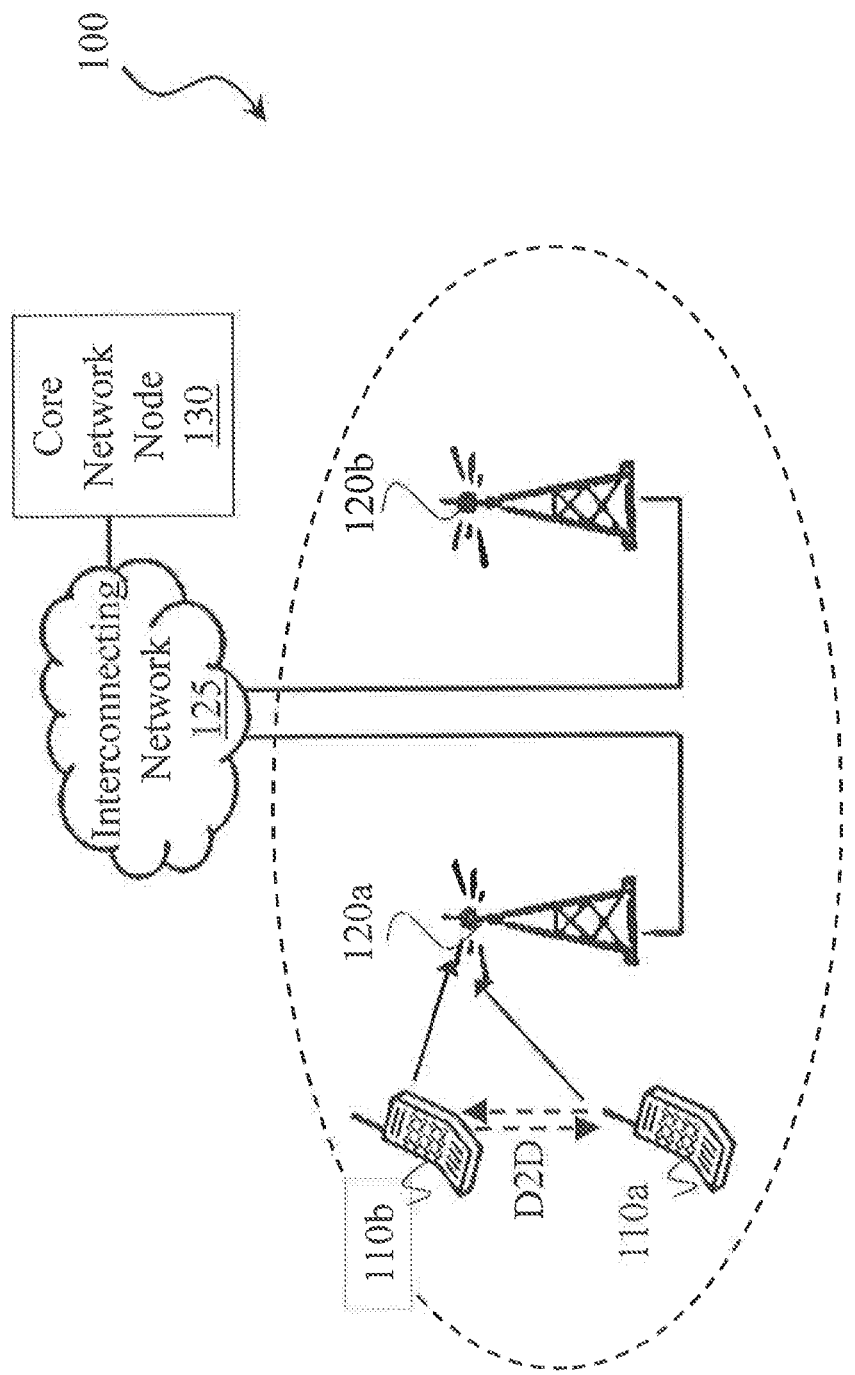
FIG. 5 is a block diagram illustrating an example of a network, in accordance with certain embodiments.

FIG. 5 illustrates an example of a wireless network 100 that may be used for wireless communications. Wireless network 100 includes a plurality of radio nodes. Examples of radio nodes include wireless devices 110a-110b (such as a UE) and radio access nodes 120a-120b (such as a gNB, eNB, or base station). The radio access nodes 120 connect to one or more core network nodes 130 via an interconnecting network 125. Wireless devices 110 within coverage area 115 may each be capable of communicating directly with radio access nodes 120 over a wireless interface. Wireless devices may also be capable of communicating with each other via device-to-device (D2D) communication.

As an example, wireless device 110a may communicate with radio access node 120a over a wireless interface. That is, wireless device 110a may transmit wireless signals and/or receive wireless signals from radio access node 120a. The wireless signals may contain voice traffic, data traffic, control signals, and/or any other suitable information. In some embodiments, an area of wireless signal coverage associated with a radio access node 120 may be referred to as a cell.

In some embodiments wireless device 110 may be interchangeably referred to by the non-limiting term user equipment (UE). Wireless device 110 refers to any type of wireless device communicating with a network node and/or with another UE in a cellular or mobile communication system. Examples of UE are target device, device to device (D2D) UE, V2x UE, machine type UE or UE capable of machine to machine (M2M) communication, PDA, PAD, Tablet, mobile terminals, smart phone, laptop embedded equipped (LEE), laptop mounted equipment (LME), USB dongles, etc. Thus, although FIG. 5 illustrates wireless devices 110 as phones, other embodiments may use other types of wireless devices 110. Example embodiments of wireless device 110 are described in more detail below with respect to FIGS. 6-7.

In some embodiments radio access node 120 may be interchangeably referred to by the non-limiting terms gNB, eNB, base station, network node, or WAN node. The WAN node can be a UE (e.g., D2D UE) or a network node (e.g., access point, base station, cellular node, etc.). Example embodiments of radio access node 120 are described in more detail below with respect to FIGS. 8-9.

In certain embodiments, radio access nodes 120 may interface with a radio network controller. The radio network controller may control radio access nodes 120 and may provide certain radio resource management functions, mobility management functions, and/or other suitable functions. In certain embodiments, the functions of the radio network controller may be included in radio access node 120. The radio network controller may interface with a core network node 130. In certain embodiments, the radio network controller may interface with the core network node 130 via an interconnecting network 125.

The interconnecting network 125 may refer to any interconnecting system capable of transmitting audio, video, signals, data, messages, or any combination of the preceding. The interconnecting network 125 may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof.

In some embodiments, the core network node 130 may manage the establishment of communication sessions and various other functionalities for wireless devices 110. Wireless devices 110 may exchange certain signals with the core network node using the non-access stratum layer. In non-access stratum signaling, signals between wireless devices 110 and the core network node 130 may be transparently passed through the radio access network. In certain embodiments, radio access nodes 120 may interface with one or more network nodes over an internode interface. For example, radio access nodes 120a and 120b may interface over an X2 interface.

Although FIG. 5 illustrates a particular arrangement of network 100, the present disclosure contemplates that the various embodiments described herein may be applied to a variety of networks having any suitable configuration. For example, network 100 may include any suitable number of wireless devices 110 and radio access nodes 120, as well as any additional elements suitable to support communication between wireless devices or between a wireless device and another communication device (such as a landline telephone). The embodiments may be implemented in any appropriate type of telecommunication system supporting any suitable communication standards and using any suitable components and are applicable to any radio access technology (RAT) or multi-RAT systems in which the wireless device receives and/or transmits signals (e.g., data). While the embodiments are described for LTE, the embodiments are applicable to any RAT, such as LTE FDD/TDD, WCDMA/HSPA, GSM/GERAN, Wi Fi, WLAN, CDMA2000, etc.

Figure 6:
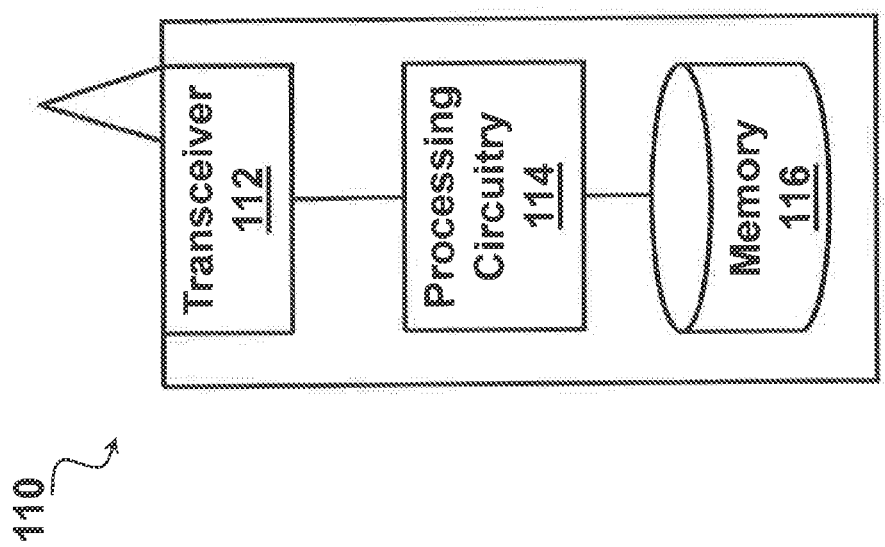
FIG. 6 is a block diagram illustrating an example of a wireless device, in accordance with certain embodiments.

FIG. 6 is a block diagram of an exemplary wireless device 110, in accordance with certain embodiments. Wireless device 110 includes a transceiver 112, processing circuitry 114 (e.g., comprising one or more processors), and memory 116. In some embodiments, transceiver 112 facilitates transmitting wireless signals to and receiving wireless signals from network node/WAN node/radio access node 120 (e.g., via an antenna), processing circuitry 114 executes instructions to provide some or all of the functionality described herein as being provided by a wireless device (or UE), and memory 116 stores the instructions executed by processing circuitry 114.

Processing circuitry 114 may include any suitable combination of hardware and software implemented in one or more modules to execute instructions and manipulate data to perform some or all of the described functions of wireless device 110, such as the functions of adaptively selecting information bit locations for polar codes. In some embodiments, processing circuitry 114 may include, for example, one or more computers, one or more central processing units (CPUs), one or more microprocessors, one or more applications, one or more application specific integrated circuits (ASICs), one or more field programmable gate arrays (FPGAs) and/or other logic. In certain embodiments, the processor may comprise one or more of the modules discussed with respect to FIG. 3 and/or FIG. 7.

Memory 116 is generally operable to store instructions, such as a computer program, software, an application including one or more of logic, rules, algorithms, code, tables, etc. and/or other instructions capable of being executed by a processor. Examples of memory 116 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information, data, and/or instructions that may be used by processing circuitry 114 of wireless device 110.

Other embodiments of wireless device 110 may include additional components beyond those shown in FIG. 6 that may be responsible for providing certain aspects of the wireless device's functionality, including any of the functionality described herein and/or any additional functionality (including any functionality necessary to support the solution described herein). As just one example, wireless device 110 may include input devices and circuits, output devices, and one or more synchronization units or circuits, which may be part of the processing circuitry. Input devices include mechanisms for entry of data into wireless device 110. For example, input devices may include input mechanisms, such as a microphone, input elements, a display, etc. Output devices may include mechanisms for outputting data in audio, video and/or hard copy format. For example, output devices may include a speaker, a display, etc.

Figure 7:
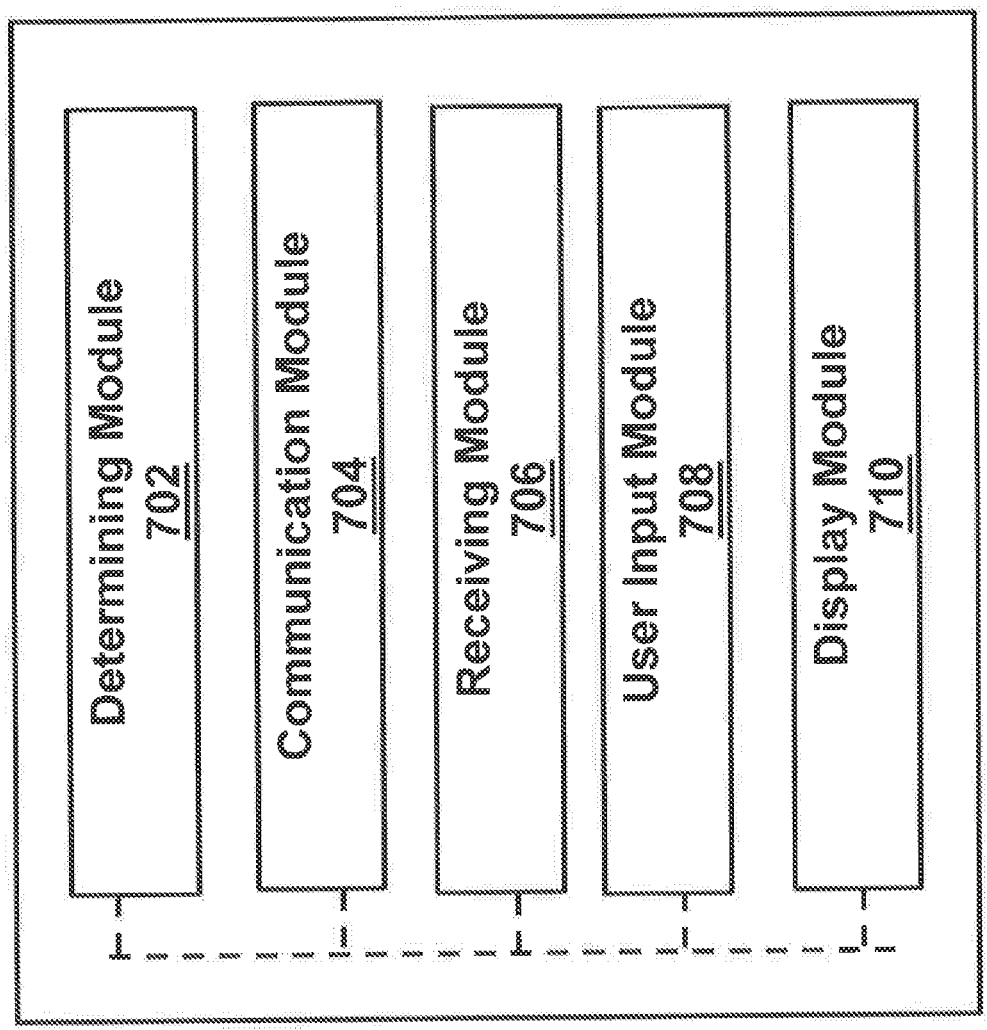
FIG. 7 is a block diagram illustrating an example of modules of a wireless device, in accordance with certain embodiments.

FIG. 7 illustrates examples of modules that can be included in wireless device 110. In certain embodiments, wireless device 110 may include any one or more of determining module(s) 702, communication module(s) 704, receiving module(s) 706, user input module(s) 708, display module(s) 710, and/or other suitable modules. The functionality of the modules may be integrated in a single component or separated among several components in any suitable manner. In certain embodiments, one or more of the modules may be implemented using processing circuitry 114 described with respect to FIG. 6.

The determining module 702 may perform the processing functions of wireless device 110 (including any of the UE functionality to support the above-described embodiments).

As one example, the determining module 702 may adaptively select information bit locations for polar codes. In some embodiments, determining module 702 may include an information set selector 302 described with respect to FIG. 3. In some embodiments, determining module 702 selects an information set for polar encoding, for example, as described with respect to the information set selection steps of FIGS. 4, 10, and/or 11. In some embodiments, determining module 702 may include a polar encoder 308 described with respect to FIG. 3. In some embodiments, determining module 702 may perform polar encoding, for example, as described with respect to the polar encoding steps of FIGS. 4, 10, and/or 11.

The determining module 702 may include or be included in one or more processors, such as processing circuitry 114 described above in relation to FIG. 6. The determining module 702 may include analog and/or digital circuitry configured to perform any of the functions of the determining module 702 and/or processing circuitry 114 described above. The functions of the determining module 702 described above may, in certain embodiments, be performed in one or more distinct modules.

The communication module 704 may perform the transmission functions of wireless device 110. For example, in certain embodiments the communication module 704 may communicate polar encoded bits to a receiver, such as radio access node 120. The communication module 704 may include a transmitter and/or a transceiver, such as transceiver 112 described above in relation to FIG. 6. The communication module 704 may include circuitry configured to wirelessly transmit messages and/or signals. In particular embodiments, the communication module 704 may receive messages and/or signals for transmission from the determining module 702. In certain embodiments, the functions of the communication module 704 described above may be performed in one or more distinct modules.

The receiving module 706 may perform the receiving functions of wireless device 110. For example, the receiving module 706 may receive system parameters and/or link measurements. The receiving module 706 may include a receiver and/or a transceiver, such as transceiver 112 described above in relation to FIG. 6. The receiving module 706 may include circuitry configured to wirelessly receive messages and/or signals. In certain embodiments, the receiving module 706 may include circuitry configured to receive information from memory 116 of wireless device 110. In particular embodiments, the receiving module 706 may communicate received messages and/or signals to the determining module 702. The functions of the receiving module 706 described above may, in certain embodiments, be performed in one or more distinct modules.

In certain embodiments, wireless device 110 may optionally include a user input module 708 that may receive user input intended for wireless device 110. For example, the user input module 708 may receive key presses, button presses, touches, swipes, audio signals, video signals, and/or any other appropriate signals. The user input module 708 may include one or more keys, buttons, levers, switches, touchscreens, microphones, and/or cameras. The user input module 708 may communicate received signals to the determining module 702. The functions of the user input module 706 described above may, in certain embodiments, be performed in one or more distinct modules.

In certain embodiments, wireless device 110 may optionally include a display module 710, which may present signals on a display of wireless device 110. The display module 710 may include the display and/or any appropriate circuitry and hardware configured to present signals on the display. The display module 710 may receive signals to present on the display from the determining module 702. The functions of the display module 710 described above may, in certain embodiments, be performed in one or more distinct modules.

Each module depicted in FIG. 7 may include any suitable configuration of hardware and/or software. Wireless device 110 may include additional modules beyond those shown in FIG. 7 that may be responsible for providing any suitable functionality, including any of the functionality described above and/or any additional functionality (including any functionality necessary to support the various solutions described herein).

In certain embodiments, some or all of the modules shown in FIG. 7 can be combined with one or more modules shown in FIG. 3. As an example, certain embodiments may combine at least some of the functionality of the information set selector (FIG. 3) with the determining module (FIG. 7).

Figure 8:
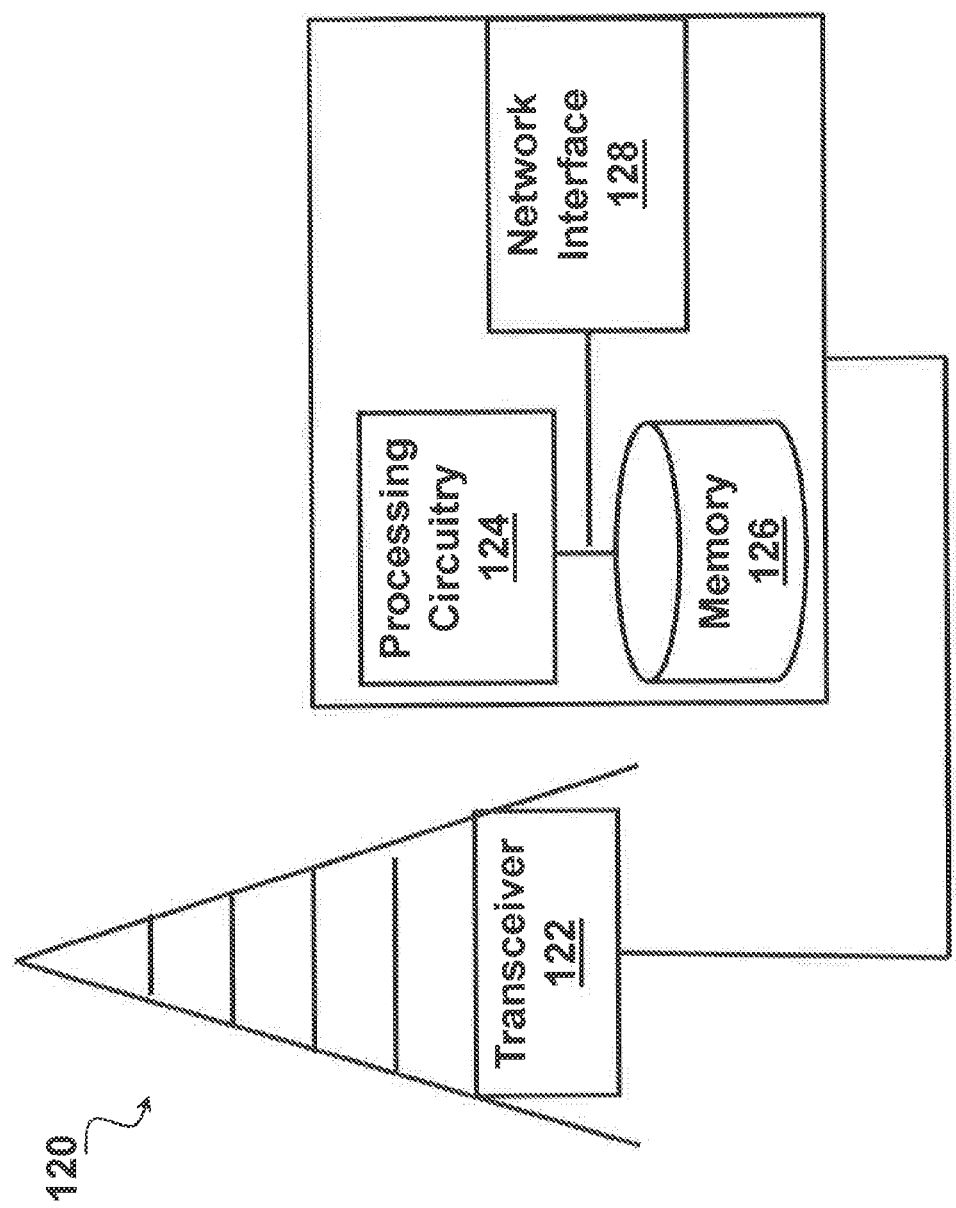
FIG. 8 is a block diagram illustrating an example of a network node, in accordance with certain embodiments.

FIG. 8 is a block diagram of an exemplary network node, such as radio access node 120, in accordance with certain embodiments. Radio access node 120 may include one or more of a transceiver 122, processing circuitry 124 (e.g., comprising one or more processors), memory 126, and network interface 128. In some embodiments, transceiver 122 facilitates transmitting wireless signals to and receiving wireless signals from wireless device 110 (e.g., via an antenna), processing circuitry 124 executes instructions to provide some or all of the functionality described herein as being provided by a radio access node 120, memory 126 stores the instructions executed by processing circuitry 124, and network interface 128 communicates signals to backend network components, such as a gateway, switch, router, Internet, Public Switched Telephone Network (PSTN), core network nodes or radio network controllers, etc.

Processing circuitry 124 may include any suitable combination of hardware and software implemented in one or more modules to execute instructions and manipulate data to perform some or all of the described functions of radio access node 120, such as the functions of adaptively selecting information bit locations for polar codes. In some embodiments, processing circuitry 124 may include, for example, one or more computers, one or more central processing units (CPUs), one or more microprocessors, one or more applications, and/or other logic. In certain embodiments, processing circuitry 124 may comprise one or more of the modules discussed with respect to FIG. 3 and/or FIG. 9.

Memory 126 is generally operable to store instructions, such as a computer program, software, an application including one or more of logic, rules, algorithms, code, tables, etc. and/or other instructions capable of being executed by a processor. Examples of memory 126 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 128 is communicatively coupled to processing circuitry 124, and network interface 128 may refer to any suitable device operable to receive input for radio access node 120, send output from radio access node 120, perform suitable processing of the input or output or both, communicate to other devices, or any combination of the preceding. Network interface 128 may include appropriate hardware (e.g., port, modem, network interface card, etc.) and software, including protocol conversion and data processing capabilities, to communicate through a network.

Other embodiments of radio access node 120 may include additional components beyond those shown in FIG. 8 that may be responsible for providing certain aspects of the radio access node 120's functionality, including any of the functionality described herein and/or any additional functionality (including any functionality necessary to support the solutions described herein). Core network node 130 may have comprise similar components as those shown in FIG. 8, however, a wireless interface (e.g., transceiver 122) is optional for the core network node 130. The various different types of network nodes may include components having the same physical hardware but configured (e.g., via programming) to support different radio access technologies, or may represent partly or entirely different physical components.

Figure 9:
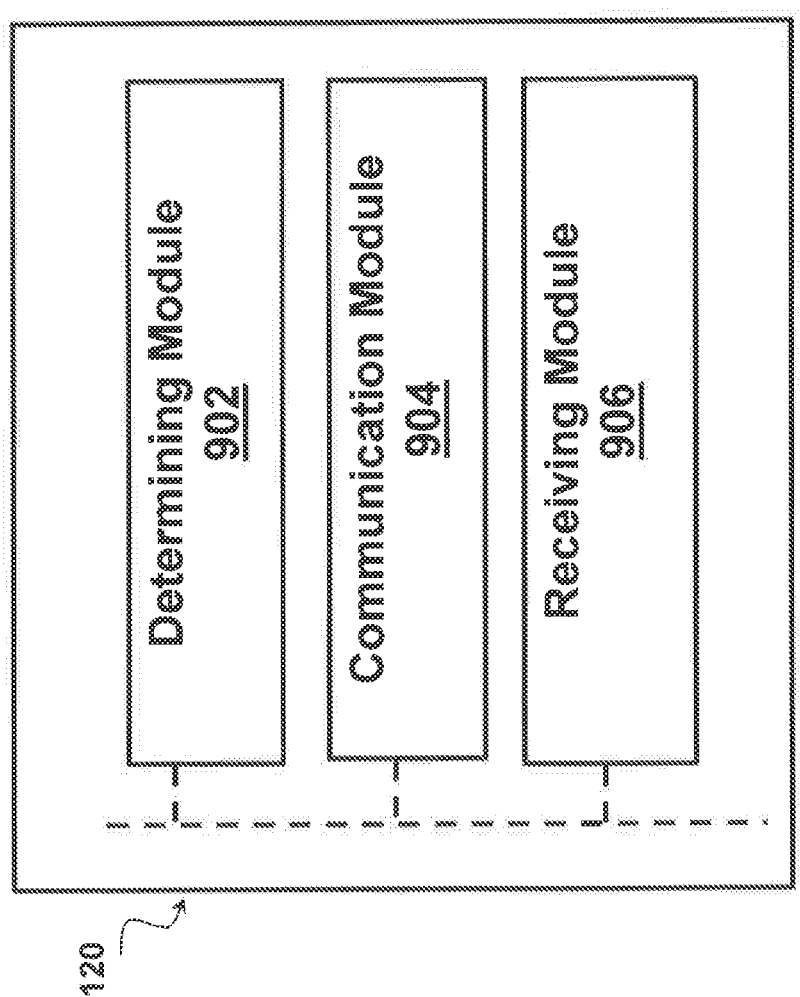
FIG. 9 is a block diagram illustrating an example of modules of a network node, in accordance with certain embodiments.

FIG. 9 illustrates examples of modules that can be included in radio access node 120. In certain embodiments, radio access node 120 may include any one or more of determining module(s) 902, communication module(s) 904, receiving module(s) 906, and/or other suitable modules. The functionality of the modules may be integrated in a single component or separated among several components in any suitable manner. In certain embodiments, one or more of the modules may be implemented using processing circuitry 124 described with respect to FIG. 8.

The determining module 902 may perform the processing functions of radio access node 120 (including any of the radio access node functionality to support the above-described embodiments). As one example, the determining module 902 may adaptively select information bit locations for polar codes. In some embodiments, determining module 902 may include an information set selector 302 described with respect to FIG. 3. In some embodiments, determining module 902 selects an information set for polar encoding, for example, as described with respect to the information set selection steps of FIGS. 4, 10, and/or 11. In some embodiments, determining module 902 may include a polar encoder 308 described with respect to FIG. 3. In some embodiments, determining module 902 may perform polar encoding, for example, as described with respect to the polar encoding steps of FIGS. 4, 10, and/or 11.

The determining module 902 may include analog and/or digital circuitry configured to perform any of the functions of the determining module 902 and/or processing circuitry 124 described above. The functions of the determining module 902 described above may, in certain embodiments, be performed in one or more distinct modules.

The communication module 904 may perform the transmission functions of radio access node 120. As one example, the communication module 90r may transmit polar encoded bits to a receiver, such as wireless device 110. The communication module 904 may include a transmitter and/or a transceiver, such as transceiver 122 described above in relation to FIG. 8. As another example, the communication module 904 may send information to other radio access nodes 120. The communication module 904 may include a network interface, such as interface 128 described above in relation to FIG. 8. The communication module 904 may include circuitry configured to transmit wireless and/or wired messages and/or signals. In particular embodiments, the communication module 904 may receive messages and/or signals for transmission from the determining module 902. In certain embodiments, the functions of the communication module 904 described above may be performed in one or more distinct modules.

The receiving module 906 may perform the receiving functions of radio access node 120. For example, the receiving module 906 may receive system parameters and/or link measurements. The receiving module 906 may include a receiver and/or a transceiver, such as transceiver 122 described above in relation to FIG. 8. As another example, the receiving module 906 may receive information from other radio access nodes 120. The receiving module 906 may include a network interface, such as interface 128 described in relation to FIG. 8. The receiving module 906 may include circuitry configured to receive wireless and/or wired messages and/or signals. In certain embodiments, the receiving module 906 may include circuitry configured to receive information from memory 124 of radio access node 120. In particular embodiments, the receiving module 906 may communicate received messages and/or signals to the determining module 902. The functions of the receiving module 906 described above may, in certain embodiments, be performed in one or more distinct modules.

In certain embodiments, some or all of the modules shown in FIG. 9 can be combined with one or more modules shown in FIG. 3. As an example, certain embodiments may combine at least some of the functionality of the information set selector (FIG. 3) with the determining module (FIG. 9).

Figure 10:
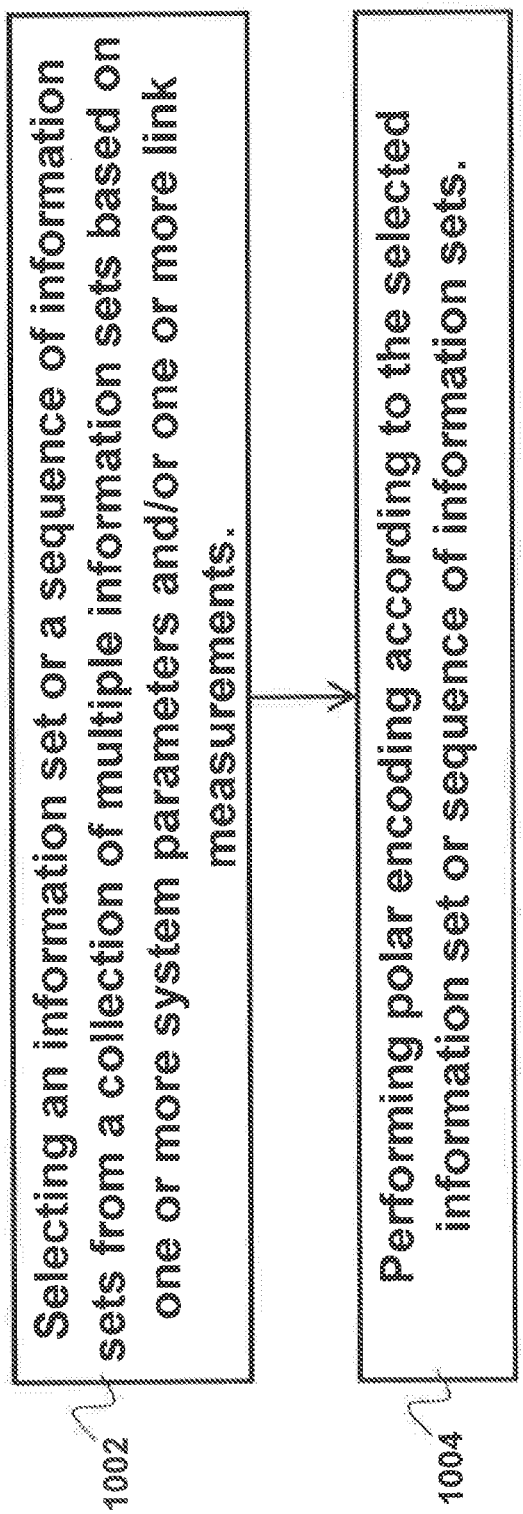
FIGS. 10-12 are flow diagrams illustrating examples of methods that may be performed by a transmitter, in accordance with certain embodiments.

FIG. 10 illustrates another example of a method for adaptive selection of information bit locations for polar codes. The following are additional examples, according to certain embodiments:

1. A method, comprising:
selecting an information set or a sequence of information sets from a collection of multiple information sets based on one or more system parameters and/or one or more link measurements; and
performing polar encoding according to the selected information set or sequence of information sets.

2. The method of example embodiment 1, wherein the one or more system parameters include one or more of: QAM modulation order, waveform or multiplexing scheme (e.g., OFDM vs. DFTS-OFDM configuration), radio resource allocation patterns, or receiver capability.

3. The method of example embodiment 1, wherein the one or more link measurements include one or more of: SNR, channel delay profile, or Doppler spread.

4. A radio node (e.g., wireless device 110 or radio access node 120), comprising processing circuitry operable to:
select an information set or a sequence of information sets from a collection of multiple information sets based on one or more system parameters and/or one or more link measurements; and
perform polar encoding according to the selected information set or sequence of information sets.

5. A polar encoder operable to:
perform polar encoding according to an information set or sequence of information sets adaptively selected based on one or more system parameters and/or one or more link measurements.

6. A computer program product comprising a non-transitory computer readable medium storing computer readable program code, the computer readable program code comprises:
program code for selecting an information set or a sequence of information sets from a collection of multiple information sets based on one or more system parameters and/or one or more link measurement; and
program code for performing polar encoding according to the selected information set or sequence of information sets.

Figure 11:
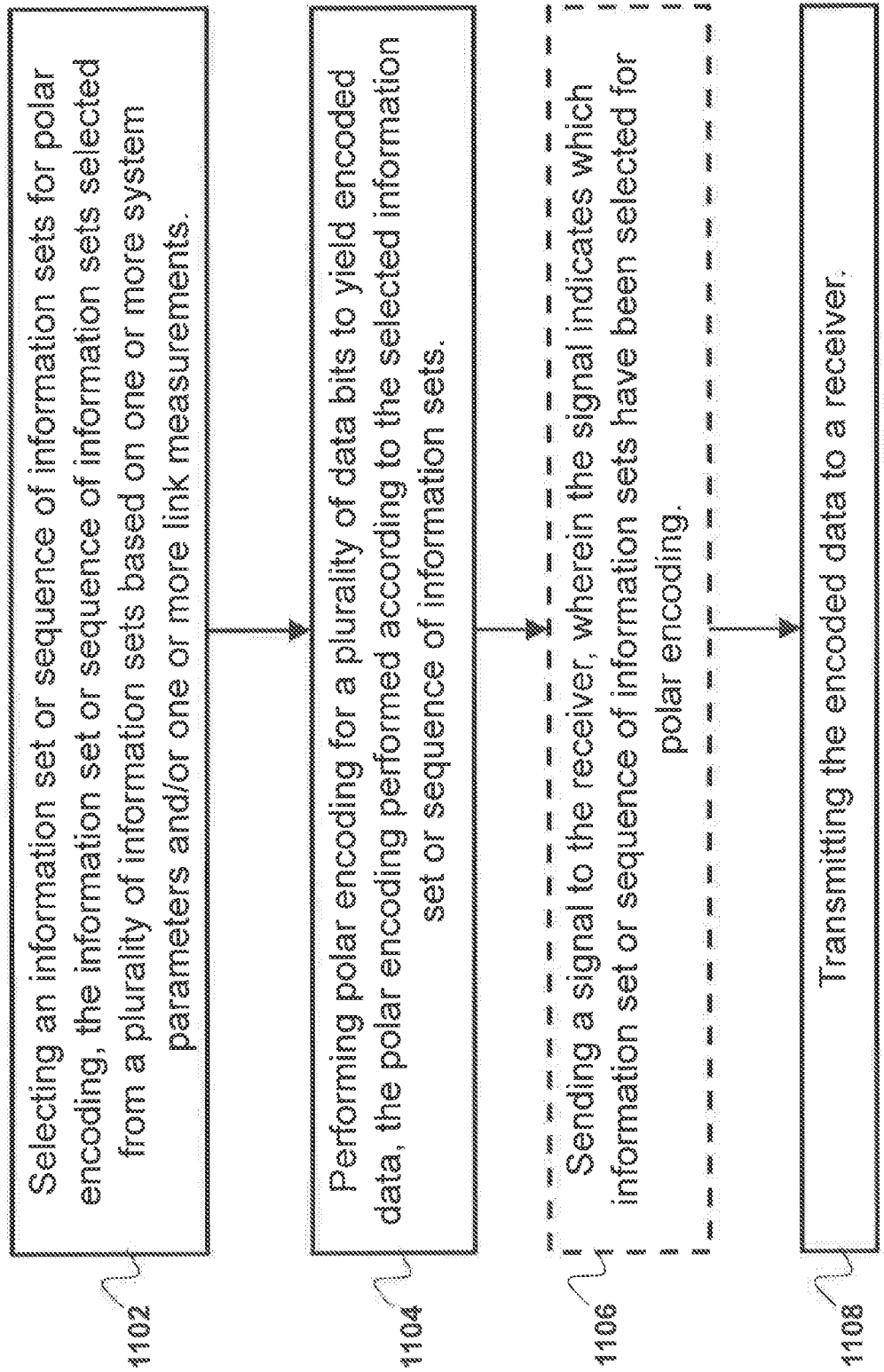

FIG. 11 illustrates an example of a method that may be performed by a transmitter. Certain embodiments implement the transmitter in a radio node, such as wireless device 110 or radio access node 120 described above.

The method begins at step 1102 with selecting an information set or sequence of information sets for polar encoding. The information set or sequence of information sets is selected from a plurality of information sets based on one or more system parameters and/or one or more link measurements.

Examples of system parameters that may be used to select the information set or sequence of information sets include any of the examples discussed above with respect to FIGS. 3-4, such as a rate matching configuration (e.g., which may comprise a puncturing pattern or a repetition pattern), a modulation scheme (e.g., based on the QAM modulation order of an n-order QAM modulation scheme, such as 16 QAM or 64 QAM), radio resource allocation with respect to frequency range or time duration, whether the encoded data is being transmitted via uplink or downlink, waveform or multiplexing scheme, number of redundancy versions being transmitted, MIMO technique, beamforming technique, beam-sweeping technique, number of data streams in a MIMO transmission, capabilities of the receiver, and/or cell size.

Examples of link measurements that may be used to select the information set or sequence of information sets include any of the examples discussed above with respect to FIGS. 3-4, such as a channel quality indicator (e.g., which may be based on SNR), channel delay spread, channel delay profile, and/or Doppler spread.

The method proceeds to step 1104 with performing polar encoding for a plurality of data bits to yield encoded data. The polar encoding is performed according to the selected information set or sequence of information sets. For example, each data bit is input into a polar encoder according to an assigned bit location that is defined by the selected information set or sequence of information sets.

Optionally, certain embodiments may send a signal to the receiver in step 1106. The signal indicates which information set or sequence of information sets have been selected for polar encoding. The signal may be semi-statically signaled, e.g., using RRC signaling or dynamically signaled, e.g., using DCI signaling. The signal may assist the receiver in determining which information set or sequence of information sets to use for decoding the encoded data that the receiver receives from the transmitter.

At step 1108, the method continues with transmitting the encoded data to a receiver. As an example, in embodiments in which the transmitter is implemented in a radio access node 120, the encoded data may be transmitted to a wireless device 110. Alternatively, in embodiments in which the transmitter is implemented in a wireless device 110, the encoded data may be transmitted to a radio access node 120.

In certain embodiments, the encoded data is transmitted according to a rate matching configuration, which may comprise a puncturing pattern or repetition pattern. Examples of rate matching configurations are described above under the heading "Adaptive Selection of Rate Matching Pattern." In general, a puncturing pattern indicates a subset of bits to be removed from encoded data before transmitting the encoded data, whereas a repetition pattern indicates a subset of bits of encoded data to be repeated before transmitting the encoded data. As a further example of a puncturing pattern, in certain embodiments, the encoded data comprises a first subset of encoded data bits and a second subset of encoded data bits, and the puncturing pattern indicates to remove the second subset of encoded data bits in response to a determination that another transmitter has been configured to transmit the second subset of encoded data bits to the receiver.

Figure 12:
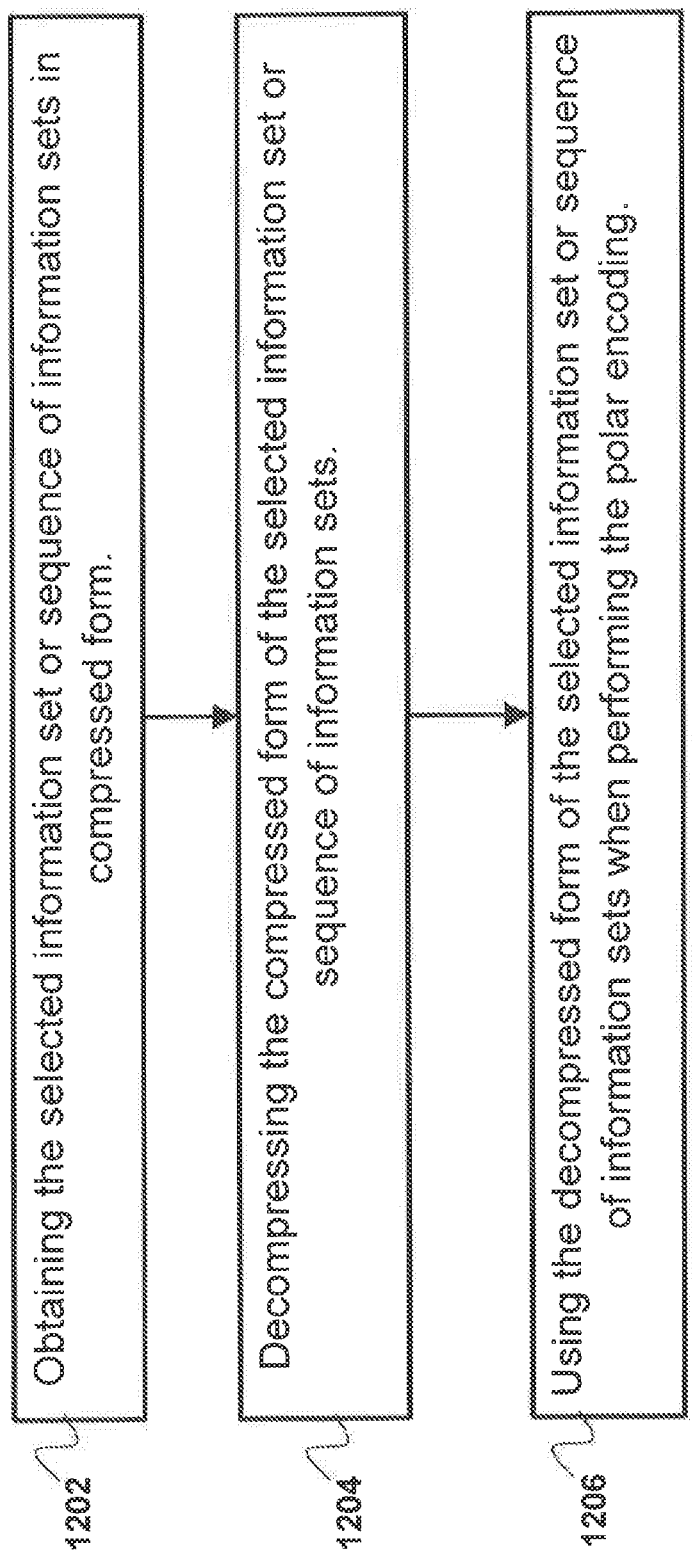

In certain embodiments, the information set or sequence of information sets selected for polar encoding in step 1102 may be stored in compressed storage. Thus, performing polar encoding according to the selected information set or sequence of information sets in step 1104 may involve the sub-steps shown in FIG. 12. In particular, FIG. 12 illustrates obtaining the selected information set or sequence of information sets in compressed form in step 1202, decompressing the compressed form of the selected information set or sequence of information sets in step 1204, and using the decompressed form of the selected information set or sequence of information sets when performing the polar encoding in step 1206.

In summary, embodiments of the present disclosure use an adaptive scheme for selecting an information set or a sequence of information sets from a collection of multiple information sets precomputed and stored in memory. Such selection is dependent on one or more system parameters (such as (QAM) modulation order, OFDM vs. DFTS-OFDM), radio resource allocation patterns, receiver capability etc.) and one or more link measurements (such as SNR, channel delay profile, Doppler spread, etc.)

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order. Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

The invention claimed is:

1. A method for use in a transmitter, the method comprising:

selecting an information set for polar encoding, the information set selected from a plurality of information sets based at least in part on one or more system parameters;

performing polar encoding for a plurality of data bits to yield encoded data bits, the polar encoding performed according to the selected information set; and transmitting a set of the encoded data bits to a receiver; wherein:

the one or more system parameters include a rate matching configuration that defines the set of the encoded data bits to transmit at an output of a polar encoder;

the information set is selected based at least in part on the rate matching configuration; and for each data bit, the information set defines an assigned bit location at an input of the polar encoder, wherein the rate matching configuration comprises a puncturing pattern indicating a subset of the bits to be removed from the encoded data bits to obtain the set of the encoded data bits to transmit, and wherein the encoded data bits comprise a first subset of encoded data bits and a second subset of encoded data bits, and wherein the puncturing pattern indicates to remove the second subset of encoded data bits in response to a determination that another transmitter has been configured to transmit the second subset of encoded data bits to the receiver.

2. The method of claim 1, wherein performing the polar encoding comprises inputting the data bits into the polar encoder, wherein each data bit is input according to the assigned bit location defined by the selected information set.

3. The method of claim 1, wherein the method is performed by a wireless device, and wherein semi-static signaling from a radio access node to the wireless device indicates at least a portion of the rate matching configuration.

4. The method of claim 1, wherein the method is performed by a wireless device, and wherein dynamic signaling from a radio access node to the wireless device indicates at least a portion of the rate matching configuration.

5. The method of claim 1, wherein the rate matching configuration comprises a repetition pattern indicating a subset of the bits of the encoded data bits to be repeated to obtain the set of the encoded data bits to transmit.

6. The method of claim 1, wherein the one or more system parameters include a modulation scheme and the information set is selected based at least in part on the modulation scheme.

7. The method of claim 6, wherein the modulation scheme corresponds to an n-order Quadrature Amplitude Modulation (QAM) modulation scheme and the information set is selected based at least in part on the QAM modulation order.

8. The method of claim 1, wherein the information set is selected based at least in part on one or more of the following system parameters: radio resource allocation with respect to frequency range or time duration, whether the set of the encoded data bits are being transmitted via uplink or downlink, waveform or multiplexing scheme, number of redundancy versions being transmitted, multiple input multiple output (MIMO) technique, beamforming technique, beam-sweeping technique, number of data streams in a MIMO transmission, capabilities of the receiver, or cell size.

9. A computer program product comprising a non-transitory computer readable medium storing computer readable program code, the computer readable program code comprises:

program code for selecting an information set for polar encoding, the information set selected from a plurality of information sets based at least in part on one or more system parameters;

program code for performing polar encoding for a plurality of data bits to yield encoded data bits, the polar encoding performed according to the selected information set; and program code for transmitting a set of the encoded data bits to a receiver;

wherein:
the one or more system parameters include a rate matching configuration that defines the set of the encoded data bits to transmit at an output of a polar encoder;

the information set is selected based at least in part on the rate matching configuration; and for each data bit, the information set defines an assigned bit location at an input of the polar encoder, wherein the rate matching configuration comprises a puncturing pattern indicating a subset of the bits to be removed from the encoded data bits to obtain the set of the encoded data bits to transmit, and wherein the encoded data bits comprise a first subset of encoded data bits and a second subset of encoded data bits, and wherein the puncturing pattern indicates to remove the second subset of encoded data bits in response to a determination that another transmitter has been configured to transmit the second subset of encoded data bits to the receiver.

10. A transmitter comprising an interface, processing circuitry, and logic, wherein the logic, when executed by the processing circuitry, causes the transmitter to:

select an information set for polar encoding, the information set selected from a plurality of information sets based at least in part on one or more system parameters;

perform polar encoding for a plurality of data bits to yield encoded data bits, the polar encoding performed according to the selected information set; and transmit a set of the encoded data bits to a receiver;

wherein:
the one or more system parameters include a rate matching configuration that defines the set of the encoded data bits to transmit at an output of a polar encoder;

the information set is selected based at least in part on the rate matching configuration; and for each data bit, the information set defines an assigned bit location at an input of the polar encoder, wherein the rate matching configuration comprises a puncturing pattern indicating a subset of the bits to be removed from the encoded data bits to obtain the set of the encoded data bits to transmit, and wherein the encoded data bits comprise a first subset of encoded data bits and a second subset of encoded data bits, and wherein the puncturing pattern indicates to remove the second subset of encoded data bits in response to a determination that another transmitter has been configured to transmit the second subset of encoded data bits to the receiver.

11. The transmitter of claim 10, wherein to perform the polar encoding, the transmitter is configured to input the data bits into the polar encoder, wherein each data bit is input according to the assigned bit location defined by the selected information set.

12. The transmitter of claim 10, wherein:
the transmitter is implemented in a wireless device; and
at least a portion of the rate matching configuration is indicated via signaling from a radio access node to the wireless device indicates, wherein the signaling comprises semi-static signaling, dynamic signaling, or both.

13. The transmitter of claim 10, wherein the rate matching configuration comprises a repetition pattern indicating a subset of the bits of the encoded data bits to be repeated to obtain the set of the encoded data bits to transmit.

14. The transmitter of claim 10, wherein the one or more system parameters include a modulation scheme and the information set is selected based at least in part on the modulation scheme.

15. The transmitter of claim 14, wherein the modulation scheme corresponds to an n-order Quadrature Amplitude Modulation (QAM) modulation scheme and the information set is selected based at least in part on the QAM modulation order.

16. The transmitter of claim 10, wherein the information set is selected based at least in part on one or more of the following system parameters: radio resource allocation with respect to frequency range or time duration, whether the set of the encoded data bits are being transmitted via uplink or downlink, waveform or multiplexing scheme, number of redundancy versions being transmitted, multiple input multiple output (MIMO) technique, beamforming technique, beam-sweeping technique, number of data streams in a MIMO transmission, capabilities of the receiver, or cell size.

17. The transmitter of claim 10, wherein the transmitter is configured to select the information set based in part on one or more link measurements, wherein the one or more link measurements comprise a channel quality indicator and the information set is selected based at least in part on the channel quality indicator.

18. The transmitter of claim 10, wherein the transmitter is configured to select the information set based in part on one or more link measurements, wherein the information set is selected based at least in part on one or more of the following link measurements: channel delay spread, channel delay profile, or Doppler spread.

19. The transmitter of claim 10, wherein the logic, when executed by the processing circuitry, further causes the transmitter to:

send a signal to the receiver, wherein the signal indicates which information set has been selected for polar encoding.

20. The transmitter of claim 10, wherein the information set is selected based on a signal received from the receiver, wherein the signal indicates which information set to select for polar encoding.

21. The transmitter of claim 10, wherein in response to selecting the information set the logic, when executed by the processing circuitry, further causes the transmitter to:

obtain the selected information set in compressed form;

decompress the compressed form of the selected information set; and use the decompressed form of the selected information set when performing the polar encoding.

22. The transmitter of claim 10, wherein the transmitter is implemented in a radio access node.

23. The transmitter of claim 10, wherein the transmitter is implemented in a wireless device.

* * * * *